United States Patent
Fischer et al.

(10) Patent No.: US 7,315,074 B2
(45) Date of Patent: Jan. 1, 2008

(54) USE OF DAR COATING TO MODULATE THE EFFICIENCY OF LASER FUSE BLOWS

(75) Inventors: Mark Fischer, Boise, ID (US); Zhiping Yin, Boise, ID (US); Thomas R. Glass, Idaho City, ID (US); Kunal R. Parekh, Boise, ID (US); Gurtej Singh Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/140,859

(22) Filed: May 31, 2005

(65) Prior Publication Data

US 2005/0218474 A1    Oct. 6, 2005

Related U.S. Application Data

(60) Continuation of application No. 10/200,413, filed on Jul. 22, 2002, now Pat. No. 6,900,515, which is a division of application No. 09/257,756, filed on Feb. 25, 1999, now Pat. No. 6,423,582.

(51) Int. Cl.
  *H01L 29/00* (2006.01)
(52) U.S. Cl. .................. 257/528; 257/209; 257/529
(58) Field of Classification Search ............... 257/528, 257/529, 209, 530
  See application file for complete search history.

(56) References Cited

U.S. PATENT DOCUMENTS

| | | | |
|---|---|---|---|
| 3,872,450 A | 3/1975 | Reynolds | |
| 4,800,177 A | 1/1989 | Nakamae | |
| 4,826,785 A | 5/1989 | Mcclure et al. | |
| 4,948,706 A | 8/1990 | Sugihara et al. | |
| 5,025,300 A | 6/1991 | Billig et al. | |
| 5,120,623 A | 6/1992 | Brosig et al. | |
| 5,578,517 A | 11/1996 | Yoo et al. | |
| 5,608,257 A | 3/1997 | Lee et al. | |
| 5,674,356 A | 10/1997 | Nagayama | |
| 5,677,884 A | 10/1997 | Zagar et al. | |
| 5,698,352 A | 12/1997 | Ogawa et al. | |
| 5,729,041 A | 3/1998 | Yoo et al. | |
| 5,774,011 A | 6/1998 | Au et al. | |
| 6,061,264 A | 5/2000 | Giust et al. | |
| 6,255,671 B1 * | 7/2001 | Bojarczuk et al. | .......... 257/103 |
| 6,259,146 B1 | 7/2001 | Giust et al. | |
| 6,323,067 B1 * | 11/2001 | Ning | .......... 438/132 |

* cited by examiner

*Primary Examiner*—Tuan H. Nguyen
(74) *Attorney, Agent, or Firm*—Schwegman, Lundberg & Woessner, P.A.

(57) ABSTRACT

The present invention relates to a laser fuse. The laser fuse comprises an element comprising a heat conductive material. The fuse also includes an absorption element comprising a material with an adjustable capacity for heat or light absorption that overlays the heat conductive element. The fuse also includes an outer insulating element that overlays and encloses the heat conductive element and the absorption element.

27 Claims, 2 Drawing Sheets

USE OF DAR COATING TO MODULATE THE EFFICIENCY OF LASER FUSE BLOWS

RELATED APPLICATIONS

This application is a Continuation of U.S. Ser. No. 10/200,413 filed Jul. 22, 2002, now issued as U.S. Pat. No. 6,900,515, which is a Divisional of U.S. Ser. No. 09/257,756 filed on Feb. 25, 1999, now issued as U.S. Pat. No. 6,423,582. These applications are incorporated herein by reference.

FIELD OF THE INVENTION

The present invention relates to a use of a deposited antireflective coating, DARC, to modulate the environmental conditions of laser fuse blows and to a laser fuse that comprises a DARC coating.

BACKGROUND OF THE INVENTION

As the number of electronic elements fabricated on and within a semiconductor with integrated circuits continues to rise, problems of reducing and eliminating defects in the elements become more difficult to solve. To increase semiconductor capacity, circuit designers have reduced the size of individual elements to maximize available space on the semiconductor. The reduced size makes the electronic elements increasingly susceptible to defects caused by material impurities during fabrication, however. These defects are identified upon completion of the integrated circuit by testing procedures either at the semiconductor chip level or after complete packaging. Scrapping or discarding an entire chip because of a finding of defective electronic elements is economically undesirable, particularly if only a small number of electronic elements are actually defective.

Relying upon zero defects in fabrication of integrated circuits is not a realistic option either. To reduce the amount of semiconductor scrap, therefore, redundant elements are fabricated on the chip. If a primary element is determined to be defective, a redundant element may be substituted for the defective element. Substantial reductions in semiconductor chip scrap can be achieved through the use of redundant elements.

One type of integrated circuit device which uses redundant elements is electronic memory. Typical memory circuits comprise millions of equivalent memory cells arranged in addressable rows and columns. By fabricating redundant elements, either as rows or columns, defective primary rows or columns are replaceable. Thus, using redundant elements reduces scrap without substantially increasing the cost of the memory circuit.

Fusible conductive links, i.e. fuses, are used in rewiring electrical circuits in order to replace defective elements with redundant elements. The circuits are rewired by rendering selected fuses non-conductive, i.e., blown, by applying energy such as laser energy to the fuse with a device such as a laser trimming machine.

In dynamic or static memory chips, defective memory cells are replaced by blowing the fuses associated with the defective cells and activating a spare row or column of redundant cells. This circuit rewiring uses fusible links and considerably enhances yields and reduces production costs.

Logic circuits may also be repaired or reconfigured by blowing fuses. For instance, it is common to initially fabricate a generic logic chip having a large number of interconnected logic gates. In a processing step, the chip is customized to perform a desired logic function by disconnecting the unnecessary logic elements by blowing the fuses that connect them to the desired circuitry.

Semiconductor chips include fusible link regions and protective insulating layers over the fusible link regions. Openings are defined through the protective insulating layers and over fusible link regions to allow a laser to irradiate the fuse. These fuse openings frequently lower chip yields and circuit reliability by allowing contamination to penetrate from the openings to the device regions.

A laser is one energy source that is typically used to blow fuses. The laser is focused through the fuse opening and irradiates the fuse. For circuits described in U.S. Pat. No. 5,729,041 ('041) which issued Mar. 17, 1998, the fabrication of the circuit includes a step of defining an opening in an area of the fuse where laser heating is most effective in breaking the fuse. Because passivation layers overlying the fuse reduce laser energy striking the fuse, the passivation layers are etched away so that the fuse is exposed or so that only a single, thin, insulating layer or a portion of an insulating layer covers the fuse.

The fuse absorbs heat from the laser irradiation and the fuse melts. In this operation, called laser trimming, a rapid temperature rise of an upper portion of the fuse causes an increase in pressure within the circuit region. The pressure causes any overlying film to be blown off. A melted polysilicon fuse is removed from the semiconductor device by evaporation. Laser trimming requires that only a very thin insulating layer cover the fuse because the laser must be able to penetrate the layer and melt the fuse. The portion of the fuse and thin insulating layer over the fuse which is melted away or blown, must not deposit on or interfere with nearby devices. The '041 patent describes an opening over the fuse which is formed of silicon nitride, silicon oxide, spin-on glass and borophosphosilicate glass (BPSG).

The Yoo et al. patent, '041, also describes an insulating layer formed on a semiconductor substrate. A fuse is formed on the insulating layer. Another insulating layer is formed over the first insulating layer and the fuse. A window opening over the fuse is formed at least partially through the second insulating layer. The window exposes either the entire fuse or a portion of the second insulating layer over the fuse. A protective passivation layer is formed on top of the insulating layer. The protective passivation layer has a greater than 50% transmittance of laser irradiation and is formed of silicon nitride.

The Lee et al. patent, U.S. Pat. No. 5,608,257 ('257), which issued Mar. 4, 1997, describes a fuse structure with a melt-away elongated metal fuse link that connects two segments of an interconnection line. The fuse also includes fins integral and coplanar to the fuse link and transversely extending from the fuse link for absorbing energy emitted by the laser beam. The fuse additionally includes a reflecting plate positioned underneath the fuse link for reflecting energy provided by the laser beam back into the fuse link. The fins and reflecting plate reduce the energy emitted by the laser beam required to blow the fuse structure.

The Zagar et al. patent, U.S. Pat. No. 5,677,884 ('884) which issued Oct. 14, 1997, describes an integrated circuit that includes an enable circuit used for enabling one of a collection of redundant elements, and a program circuit for selectively programming the enabled redundant element. The programmed redundant element may be used to replace a defective primary element. The integrated circuit also includes a nonvolatile disable circuit for disabling the enabled redundant elements.

The Billig et al. patent, U.S. Pat. No. 5,025,300 ('300) which issued Jun. 18, 1991, describes a conductive fusible link that is blown by laser energy. A dielectric material covering the fuse is etched away to expose the fuse. A protective dielectric layer is formed on the fuse to a controlled thickness less than that of the interlevel dielectric.

SUMMARY OF THE INVENTION

One embodiment of the present invention includes a laser fuse. The laser fuse comprises an element comprising a heat conductive material. Overlaying the heat conductive element is an absorption element comprising a material with an adjustable capacity for heat or light absorption. An outer insulating element overlays and encloses the heat conductive element and the absorption element with the adjustable capacity for heat or light absorption.

Another embodiment of the present invention includes a fuse bank. The fuse bank comprises a plurality of fuses wherein each fuse comprises an element comprising a heat conductive material, an absorption element comprising a material with an adjustable capacity for heat or light absorption that overlays the heat conductive element and an outer insulating element that overlays and encloses the heat conductive element and the absorption element. The fuse bank also includes a gate positioned between two fuses of the plurality of fuses.

Another embodiment of the present invention includes a transistor. The transistor comprises one or more laser fuses comprising an absorption element with a silicon-to-nitride ratio effective for absorbing laser energy within a first narrow wavelength range. The transistor also comprises one or more laser fuses comprising an absorption element with a stoichiometric silicon-to-nitride ratio effective for absorbing laser energy within a second narrow wavelength range different from the first wavelength range. The transistor also includes a plurality of circuits protected by the laser fuses.

Another embodiment of the present invention includes a method for making a laser fuse. The method includes providing a semiconductor substrate and overlaying the substrate with an element comprising a heat conductive material. This heat conductive element is overlayed with an absorption element that comprises a material with an adjustable capacity for heat or light absorption. The absorption element is overlayed with an outer insulating element that encloses the heat conductive element and the absorption element.

One other embodiment of the present invention includes a method for blowing a laser fuse utilizing a particular laser energy level. The method comprises providing a laser fuse comprising a heat conductive material. Overlaying the heat conductive element is an absorption element comprising a material with an adjustable capacity for heat or light absorption. An outer insulating element overlays and encloses the heat conductive element and the absorption element with the adjustable capacity for heat or light absorption. The method also includes exposing the laser fuse to a laser until the fuse blows.

Another embodiment of the present invention includes a method for adjusting energy required to blow a fuse. The method comprises providing a fuse with an absorption element that has an adjustable capacity for heat or light absorption. The element is comprised of silicon and nitride wherein the stoichiometric silicon-to-nitride ratio is adjusted to impart a susceptibility to the fuse to blow when the fuse is subjected to a particular energy level in a form of heat or light.

In one other embodiment of the present invention is another method for adjusting energy required to flow a fuse. This method comprises providing a fuse with an absorption element that has an adjustable capacity for heat or light absorption. The element is comprised of silicon and nitride. The thickness of the element is adjusted to impart a susceptibility to the fuse to blow when the fuse is subjected to a particular energy level in a form of heat or light.

One other embodiment of the present invention includes a method for making a fuse that reduces footing or undercutting. The method comprises providing a semiconductor substrate and overlaying the substrate with a heat conductive material. The heat conductive material is overlayed with an absorption material comprising silicon nitride in a stoichiometric ratio of silicon-to-nitride of at least about 3 to 4 wherein the absorption material reduces profile distortion. The method also includes forming fuse features by photolithography whereby profile distortion is reduced.

DETAILED DESCRIPTION

Figure 1:
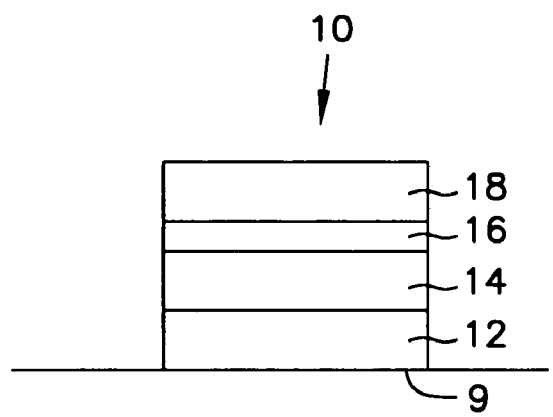
FIG. 1 is a cross-sectional view of one embodiment of a fusible link stack of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the invention.

For purposes of this specification, the terms "chip", "wafer" and "substrate" include any structure having an exposed surface of semiconductor material with which to form integrated circuit (IC) structures. These terms are also used to refer to semiconductor structures during processing and may include other layers that have been fabricated thereupon. The terms include doped and undoped semiconductors, epitaxial semiconductor layers supported by a base semiconductor or insulator, as well as other semiconductor structures known in the art. The term "conductor" is understood to include semiconductors, and the term "insulator" is defined to include any material that is less electrically conductive than the materials referred to as "conductors." The following detailed description is, therefore, not to be taken in a limiting sense.

One embodiment of a fusible link of the present invention, illustrated generally at 10 in FIG. 1 in cross-section, includes a bottom polycrystalline silicon layer 12, a layer 14 comprising a highly heat conductive material such as silicide, refractory metal silicide, low silane oxide, tungsten or other highly heat conductive metal or metal alloy overlaying the polycrystalline silicon layer 12, a DARC layer 16 overlaying the silicide or low silane or tungsten layer 14 and a silicon nitride layer 18 overlaying the DARC layer 16. The DARC layer has an absorption coefficient that permits fabrication of a fuse 10 that will blow at a particular, predictable laser energy level. The absorption coefficient is adjustable by adjusting the stoichiometric ratio of silicon-to-nitride and by adjusting the thickness of the DARC layer.

The fusible link 10 overlays, typically, a thick field oxide region of a semiconductor substrate 9 as is shown in FIG. 1. Positioning the fusible link 10 over the thick field oxide prevents shorting of the fusible link 10.

The DARC coating 16 has a versatility that permits the coating 16 to be fabricated to have desired absorption characteristics, reflectivity or other optical properties that render the fuse either easier or more difficult to blow. With the fuse of the present invention, laser energy required to blow the fuse may be preselected by adjusting the thickness of the DARC coating or the stoichiometric ratio of silicon-to-nitride. In particular, with the DARC coating 16, the fusible link 10 may be individually fabricated in accordance with unique, narrowly defined, blow criteria. It has surprisingly been found that the DARC coating of the present invention has a multiple functionality. In addition to preventing undesirable light reflection in a photolithography process, the DARC coating may be used to preselect laser energy required to blow a fuse. The DARC coating is additionally useable in preventing profile distortion in photolithography fabrication.

"DARC" coating as used herein refers to a deposited antireflective coating. The DARC material comprises a silicon-rich oxide, silicon-rich nitride or silicon-rich oxynitride, in general $Si_xO_yN_z$:H.

"BARC" coating as used herein refers to a bottom antireflective coating.

"Fuse" or "fusible link" as used herein refers to a circuit component which can be blown to allow a desired memory cell or logic gate to be programmed.

Figure 5:
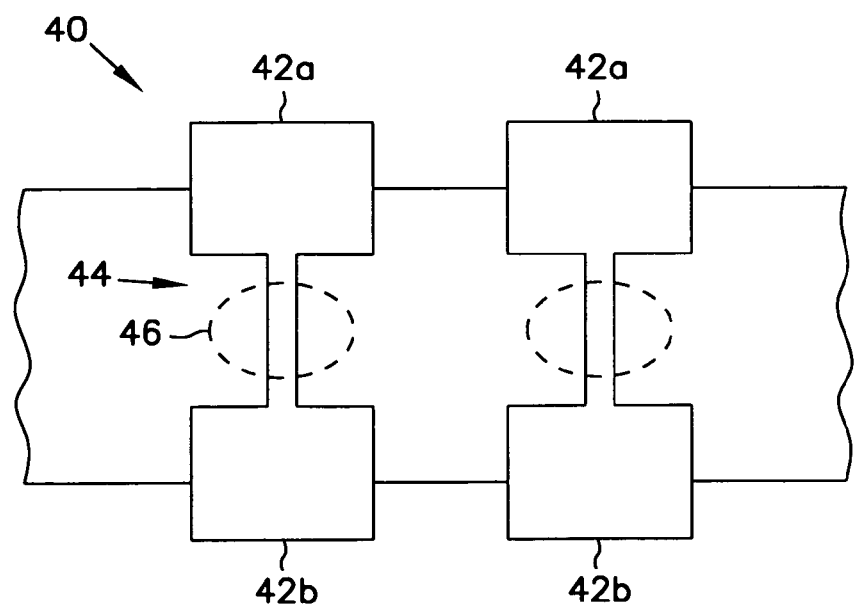
FIG. 5 is a top plan view of one embodiment of a logic circuit of the present invention.

Typically, a fuse structure such as is shown in one embodiment at 40 in FIG. 5, includes two ends of a conductive line 42a and 42b, respectively, attached to a fuse link 44. Also shown in FIG. 5 is an optimal position of laser spot 46. The energy transmitted by the laser is typically lost in the area enclosed by the spot 46, and only a fraction of the total energy is absorbed by the fusible link 44. As a result, the amount of energy required to "blow" the fuse 40 is much greater than that required if most of the energy could somehow be channeled to the fusible link 44. The fuse 40 of the present invention may be constructed to "blow" at a lower temperature or at a higher temperature as compared to conventional fuses, depending upon the stoichiometric silicon-to-nitride ratio selected for the DARC coating. Additionally, the fuse of the present invention is constructed to blow within a narrow range of laser energy exposure.

Figure 2:
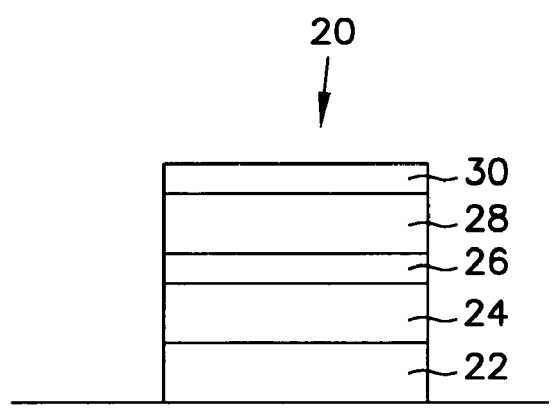
FIG. 2 is a cross-sectional view of one prior art embodiment of a laser gate antifuse stack.

One other benefit of the fuse of the present invention is that it is compatible with a conventional prior art fuse, such as is shown at 20 in FIG. 2. The fuse 20, shown in cross section in FIG. 2, includes a polycrystalline silicon layer 22 which functions as an insulating layer, a siloxane or tungsten layer 24 that overlays the polycrystalline silicon layer, a low silane oxide layer 26 that overlays the siloxane layer 24 and a silicon nitride layer 28, also functioning as an insulating layer that overlays the low silane oxide layer 26.

A BARC coating may optionally overlay the silicon nitride coating 28. The BARC coating 30 is a bottom antireflective coating. The BARC coating is applied in order to improve the photolithographic process by improving definition by reducing reflection. The BARC coating is typically removed in the photolithography process.

One benefit of using a DARC coating at 16 as shown in FIG. 1, instead of the BARC coating 30, as shown in FIG. 2, or another prior art coating, such as a low silane oxide, is that the DARC coating 16 enhances the versatility of the fuse of the present invention with respect to blow requirements. The DARC coating may be adjusted chemically in order to have reflective characteristics or absorption characteristics that render the fuse more or less likely to blow, as desired.

One benefit of this adaptability is that damage to a semiconductor substrate caused by the laser energy used to blow the fuse is minimized. For fuses which lack the DARC coating, twenty-to-sixty percent of laser energy directed at the fuse is either reflected or transmitted due to a multilayer interference effect. Thus, substantial damage to the substrate 9 can easily occur on areas not covered by the fuses, due to a high rate of energy absorption and a high percentage of laser energy transmitted, in addition to the higher amount of laser energy that is currently used to "blow" the fuse link. The damage may be manifested by a plurality of craters blown within the substrate from multiple bursts of laser energy. The fuse of the present invention may be fabricated to blow with less laser energy than conventional fuses. As a result, less damage is done to the underlying substrate.

One additional benefit of the DARC coating as compared to the BAR coating is that the DARC coating does not produce a problem of "footing" in the fuse resist profile during fuse manufacture. This benefit is particularly important in the fabrication of very small circuitry. The DARC coating has been found to have more desirable photolithographic properties than the BARC coating. The DARC coating is, therefore, more reliable and produces a more uniform product than the BARC coating. The DARC coating also provides to manufacturers a larger process "window" with respect to circuit size within which to make acceptable products as compared to the BARC coating.

The DARC coating comprises a silicon film 16 as shown in FIG. 1. The thickness of the silicon film 16 modulates and focuses energy from a source such as a laser. For instance, a thin oxide layer requires less energy for the fuse to blow than a thick oxide layer because of the insulating properties of the oxide layer. Energy from the laser is transformed into heat, within the fuse, which elevates the temperature of the tungsten silicide layer 14 and the polycrystalline silicon layer 12. The silicon nitride layer 18 insulates the fuse and encloses the tungsten silicide and polycrystalline silicon. While silicon nitride is described, it is understood that other insulating layers, such as silicon oxide are suitable for use. The heat energy consequently causes pressure to increase within the fuse. When pressure within the fuse exceeds the bond strength of the silicon nitride, the silicon nitride layer 18 is "blown off" and any melted material is removed by evaporation.

The fuse 10 of the present invention is formed over an isolating layer 9 formed on a portion of a semiconductor substrate. The isolating layer 9 electrically isolates adjacent semiconductor devices from each other. The isolating layer 9 is formed of a dielectric material and is preferably formed of a thick silicon oxide, called a field oxide. In one embodiment, the field oxide is formed by a process such as shallow trench isolation. In another embodiment, the field oxide is a silicon oxide which is grown at atmospheric pressure at a temperature between 700 to 1200 degrees Centigrade in a wet or a dry oxygen atmosphere in a thermal furnace. In one embodiment, the fuse 10 is formed by a method such as photolithography.

Figure 3:
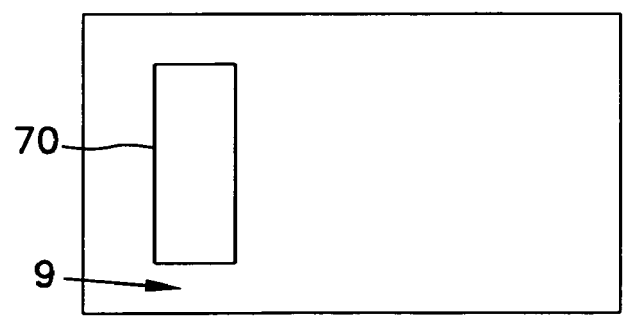
FIG. 3 is a top plan view of the fuse link stack of FIG. 1.
Figure 4:
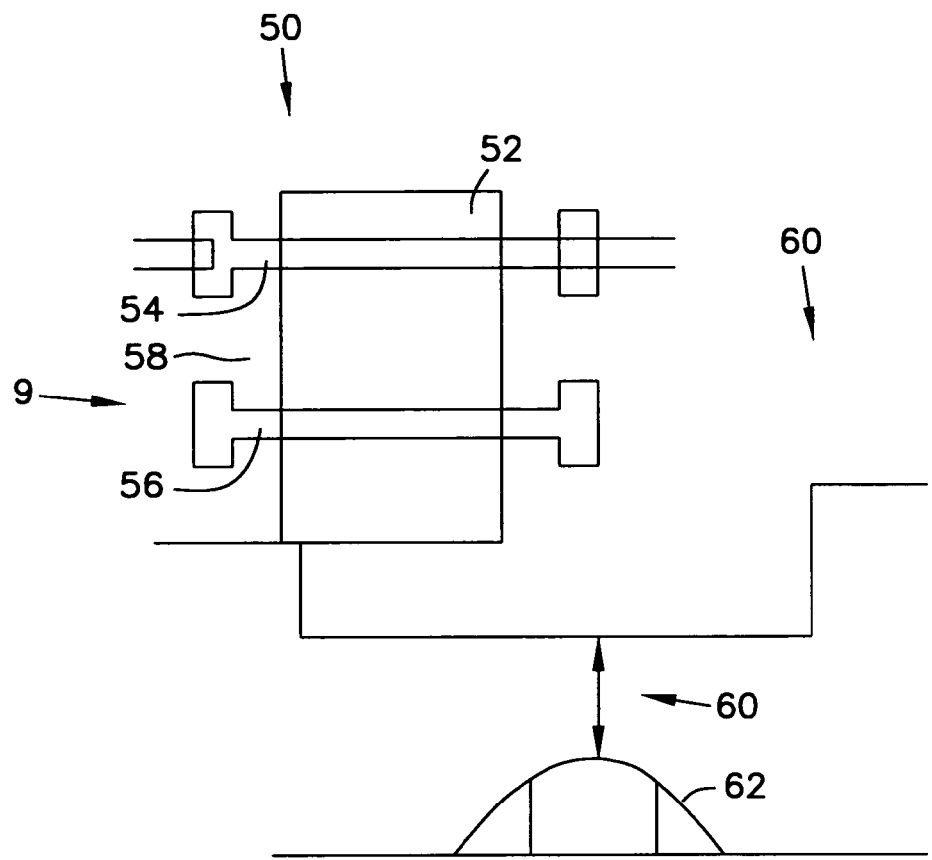
FIG. 4 is a top plan view of a memory cell of the present invention.

In one embodiment, a fuse bank, such as is shown at 50 in FIG. 4 or 70 in FIG. 3 is formed over the field oxide 9. The fuse bank 50 is part of a patterned metal layer formed over the field oxide layer 9. The field oxide 9 isolates the fuse bank 50 and the fuse bank 70 from adjacent devices and from the substrate.

The fuse bank 50 includes fuses 54 and 56. The fuse bank 50 may also be formed over a material such as borophosphosilicate glass. A gate stack 58 is positioned between the fuses 54 and 56. The fuse bank 50 defines an opening 60. An adjacent gate stack 62 is separated from the fuse bank 50 by an oxide. The oxide has a substantially uniform depth of about 3000 Angstroms.

The fuse 10 may be formed utilizing a metal such as tungsten or polysilicon. The fuse 10 may also be formed of a polycide. The fuse 10 typically has a thickness of about 500 to 5000 Angstroms, a length in a range of 5 to 10 microns and a width of 1 to 3 microns.

A top layer 18 of the fuse 10 is a protective dielectric film which is highly transparent to laser energy. This protective dielectric film is formed of either plasma enhanced chemically deposited (PECVD) silicon nitride or low pressure CVD (LPCVD) silicon nitride.

In one embodiment, the silicon nitride is deposited using a plasma enhanced chemical vapor deposition process by reacting silane and ammonia in a nitrogen plasma at a temperature of 200 to 550 degrees Centigrade, with a ratio of $SiH_4$-to-$NH_3$ from 0.5 to 10.0, a pressure range of 2 to 10 Torr, an electrode spacing of 400-to-600 mils and a radio frequency power setting of 100 to 800 watts. The silicon nitride top layer has a thickness of about 0.1-to-0.2 microns. In another embodiment, the silicon nitride is deposited using a low pressure chemical vapor deposition process by reacting dichlorosilane (DCS) and ammonia at a pressure as low as about 250 millitorr.

The fuse 10 of the present invention is usable on static or dynamic memory chips in order to replace defective memory cells and to activate a spare row or column of cells. The fuse 10 is also usable in a logic circuit. A logic chip may be fabricated with a large number of interconnected logic gates. In a final processing step, the chip is customized to perform a desired logic function by disconnecting unnecessary logic elements by blowing the fuses that connect them to the desired circuitry.

In one embodiment, the transmittance of a laser beam through the silicon nitride layer is greater than 50%. Preferably, the transmittance of the laser beam is greater than 50% at a laser irradiation wavelength in the range of 1037-to-1057 nanometers. The laser used can be a Yttrium—Yag laser at wavelengths within a range of 1037-to-1057 nanometers and a pulse less than 35 nanoseconds.

The fusible link of the present invention may have one of a variety of symmetries. In one embodiment such as is illustrated at 40 in FIG. 5, each fusible link 42*a* and 42*b* includes a target area 46 of a metal runner 44 that is of the same geometry, width and height, as the rest of the runner. In another embodiment, the fusible links 54 and 56 include a portion of a metal runner 52 that has reduced cross-sectional area for improved ease of blowing by laser energy.

The fuse bank 50 of the present invention is typically fabricated concurrently with a memory component such as a gate stack 58 and 62. In one embodiment, the fuse bank 50 is fabricated with the same passivation steps as are used to fabricate the gate 58.

Although specific embodiments have been illustrated and described herein, it will be appreciated by those of ordinary skill in the art that any arrangement which is calculated to achieve the same purpose may be substituted for the specific embodiment shown. This application is intended to cover any adaptions or variations of the present invention. Therefore, it is manifestly intended that this invention be limited only by the claims and the equivalents thereof.

What is claimed is:

1. A fuse, comprising:
a substrate;
a patterned heat conductive material disposed over the substrate;
a patterned, wavelength adjustable absorption material disposed in contact with the heat conductive material; and
an insulating material having a selected thickness and a selected optical transparency disposed over the patterned absorption material.

2. The fuse of claim 1, wherein the patterned, wavelength adjustable absorption material comprises a silicon-rich silicon nitride material having a specific range of silicon to nitrogen atomic ratios.

3. The fuse of claim 2, wherein the silicon to nitrogen atomic ratio is between 3:4 to 1:1.

4. The fuse of claim 2, wherein the silicon to nitrogen atomic ratio is greater than 3:4.

5. The fuse of claim 1, wherein the patterned wavelength adjustable absorption material comprises an insulating layer having absorption characteristics and a thickness designed to absorb radiation at a selected wavelength.

6. The fuse of claim 5, wherein the selected wavelength is in the 1037 to 1057 nanometer wavelength range.

7. The fuse of claim 1, wherein the insulating material having a selected thickness and a selected optical transparency comprises a silicon nitride layer having an optical transmittance of greater than 50% in a 1037 to 1057 nanometer wavelength range.

8. The fuse of claim 1, further comprising an integrated circuit formed in the substrate and electrically connected to the fuse.

9. The fuse of claim 8, further including a dynamic memory array on the semiconductor substrate in communication with the fuse for selecting a redundant portion of the dynamic memory array to replace a defective portion of the dynamic memory array.

10. The fuse of claim 8, further including providing a static memory array on the semiconductor substrate in communication with the fuse for selecting a redundant portion of the static memory array to replace a defective portion of the static memory array.

11. The fuse of claim 8, further including providing a logic array on the semiconductor substrate in communication with the fuse for selecting a redundant portion of the logic array to replace a defective portion of the logic memory array.

12. The fuse of claim 1, further including a fusible link disposed in a portion of the fuse.

13. The fuse of claim 12 wherein the fusible link comprises a portion of the fuse having a width of the patterned heat conductive material that is reduced from the width of a remaining portion of the patterned heat conductive material.

14. The fuse of claim 13 further including a patterned layer of conductive polycrystalline silicon disposed between the patterned heat conductive material and the substrate, wherein the portion of the patterned conductive polysilicon disposed beneath the fusible link has a width that is reduced to approximate the width of the patterned heat conductive material of the fusible link.

15. A fuse, comprising:
a substrate;
a patterned heat conductive material disposed over the substrate;
a patterned layer of conductive polycrystalline silicon disposed between the patterned heat conductive material and the substrate;
a patterned, wavelength adjustable absorption material disposed over the heat conductive material; and
an insulating material having a selected thickness and a selected optical transparency disposed over the patterned absorption material.

16. The fuse of claim 15, wherein the patterned, wavelength adjustable absorption material comprises a silicon-rich silicon nitride material having a specific range of silicon to nitrogen atomic ratios.

17. The fuse of claim 16, wherein the silicon to nitrogen atomic ratio is between 3:4 to 1:1.

18. The fuse of claim 15, wherein the silicon to nitrogen atomic ratio is greater than 3:4.

19. The fuse of claim 15, wherein the silicon to nitrogen atomic ratio is less than 1:1.

20. The fuse of claim 15, wherein the patterned wavelength adjustable absorption material comprises an insulating layer having an absorption characteristic and a thickness designed to absorb radiation at a selected wavelength.

21. The fuse of claim 20, wherein the selected wavelength is in the 1037 to 1057 nanometer wavelength range.

22. The fine of claim 15, wherein the insulating material having a selected thickness and a selected optical transparency comprises a silicon nitride layer having an optical transmittance of greater than 50% in a 1037 to 1057 nanometer wavelength range.

23. A laser fuse, comprising:
a substrate;
a patterned heat conductive material disposed over the substrate;
a patterned absorption material disposed in contact with the heat conductive material disposed to efficiently absorb laser radiation at a selected wavelength; and
an insulating material having a selected thickness and selected optical transparency to allow at least 50% of laser light to be transmitted to the patterned absorption material disposed over the patterned absorption material.

24. The laser fuse of claim 23, wherein the heat conductive material comprises tungsten.

25. The laser fuse of claim 23, wherein the heat conductive material comprises a refractory metal.

26. The laser fuse of claim 23, wherein the heat conductive material comprises a refractory metal silicide material.

27. The laser fuse of claim 23, wherein the selected laser wavelength is in a range of from 1037 to 1057 nanometers.

* * * * *

UNITED STATES PATENT AND TRADEMARK OFFICE
CERTIFICATE OF CORRECTION

PATENT NO.         : 7,315,074 B2                                                Page 1 of 1
APPLICATION NO. : 11/140859
DATED              : January 1, 2008
INVENTOR(S)       : Fischer et al.

It is certified that error appears in the above-identified patent and that said Letters Patent is hereby corrected as shown below:

In column 8, line 31, in Claim 6, delete "1057nanometer" and insert
-- 1057 nanometer --, therefor.

In column 9, line 18, in Claim 17, delete "3:4to" and insert -- 3:4 to --, therefor.

In column 9, line 28, in Claim 21, delete "1057nanometer" and insert
-- 1057 nanometer --, therefor.

In column 10, line 1, in Claim 22, delete "fine" and insert -- fuse --, therefor.

In column 10, line 26, in Claim 27, delete "1057nanometers" and insert
-- 1057 nanometers --, therefor.

Signed and Sealed this

Twenty-ninth Day of April, 2008

JON W. DUDAS
*Director of the United States Patent and Trademark Office*